(12) United States Patent
Matsuse

(10) Patent No.: US 6,251,191 B1
(45) Date of Patent: Jun. 26, 2001

(54) PROCESSING APPARATUS AND PROCESSING SYSTEM

(75) Inventor: Kimihiro Matsuse, Inagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/191,118

(22) Filed: Nov. 13, 1998

(30) Foreign Application Priority Data

Nov. 14, 1997 (JP) .................................................. 9-331208

(51) Int. Cl.[7] .................................................. C23C 16/00
(52) U.S. Cl. .......................... 118/719; 156/345; 118/723; 118/728; 204/298.25; 204/298.35; 438/685; 438/689
(58) Field of Search .................................. 118/719, 723, 118/728; 156/345; 204/298.25, 298.35; 438/685, 689

(56) References Cited

U.S. PATENT DOCUMENTS

| | | | |
|---|---|---|---|
| 4,715,921 | * 12/1987 | Maher et al. | 156/345 |
| 4,795,299 | * 1/1989 | Boys et al. | 414/217 |
| 4,971,667 | * 11/1990 | Yamazaki et al. | 204/192.32 |
| 4,987,004 | * 1/1991 | Yamazaki et al. | 427/38 |
| 5,013,385 | * 5/1991 | Maher et al. | 156/345 |
| 5,704,981 | * 1/1998 | Kawakami et al. | 118/715 |
| 5,785,796 | * 7/1998 | Lee | 156/345 |
| 5,899,801 | * 5/1999 | Tolles et al. | 457/288 |
| 5,900,062 | * 5/1999 | Loewenhardt et al. | 118/723 R |
| 5,900,064 | * 5/1999 | Khlodenko | 118/723 R |

* cited by examiner

Primary Examiner—Robert Kunemund
Assistant Examiner—Vanessa Perez-Ramos
(74) Attorney, Agent, or Firm—Oblon, Spivak, McClelland, Maier & Neustadt, P.C.

(57) ABSTRACT

One of the disclosed processing apparatus includes a processing vessel having an inner processing space defined by a ceiling portion, a bottom portion, and side walls and capable of being evacuated to a predetermined vacuum, a mounting table which has a first mounting surface for mounting the object thereon and a second mounting surface facing an opposite side to which the first mounting surface faces, which is supported by the ceiling portion of the processing vessel, and which extends toward the bottom portion of the processing vessel in such a way that the first and second mounting surfaces face the side walls of the processing vessel, a process gas supply mechanism, for supplying a process gas to the inner processing space, and a loading/unloading portion having an opening formed in the bottom portion of the processing vessel and an open/close device for opening/closing the opening, for loading/unloading the object into/from the processing vessel.

18 Claims, 9 Drawing Sheets

PROCESSING APPARATUS AND PROCESSING SYSTEM

BACKGROUND OF THE INVENTION

The present invention relates to a processing apparatus for applying a predetermined process to an object, and a processing system having the processing apparatus.

As the processing apparatus for applying a predetermined process (such as film formation, etching, oxidative diffusion) to a semiconductor wafer to form a semiconductor integrated circuit, a batch-type processing apparatus and a single-wafer processing apparatus are generally known. In the batch-type processing apparatus, a plurality of wafers stacked one upon the other with a predetermined pitch are processed at the same time. Whereas, in the single-wafer processing apparatus, wafers are processed one by one at high speed. As a size of the wafer increases from 6 to 8 inches or to 300 mm in diameter, the single-wafer processing apparatus tends to be used since the resultant film can be obtained uniformly.

The single-wafer processing apparatus such as a film formation apparatus has a cylindrical processing vessel capable of producing a vacuum therein, a table (susceptor) arranged horizontally within the processing vessel for mounting an object to be processed such as a semiconductor wafer thereon, a heater (or a heating lamp) arranged under the-table for heating the object mounted on the table, and a shower head arranged on a ceiling portion of the processing vessel so as to face the table. With this structure, a requisite gas is sprayed to the object from the shower head while heating the object (horizontally placed on the table) and maintaining it at a predetermined processing temperature by the heater. In this manner, a predetermined process including film formation can be applied to the object.

FIG. 14 shows a processing system having two single-wafer processing apparatuses 6 constructed as mentioned above. As shown in the figure, the processing system has a transfer chamber 4 having a foldable and rotatable transfer arm 2, a load-lock chamber 8 connected to the transfer chamber 4 with an openable gate valve G1 interposed between them, and a cassette chamber 10 connected to the load-lock chamber 8 with an openable gate valve G2 interposed between them. The cassette chamber 10 is used for loading a cassette which stores unprocessed objects into the system or unloading a cassette which stores processed objects from the system. To increase a processing efficiency, two processing apparatuses 6, 6 are connected to the transfer chamber 4 with openable gate valves G3, G4 interposed between them.

To maintain the transfer chamber 4 always at a predetermined vacuum, the load-lock chamber 8 is interchangeably set between an atmospheric pressure and a vacuum, repeatedly. More specifically, when the load-lock chamber 8 is-communicated with the cassette chamber 10 under atmospheric pressure, the load-lock chamber 8 is set at the atmospheric pressure while leaving the gate valves G1, G2 closed. Thereafter, the gate valve G2 is opened. On the other hand, when the load-lock chamber 8 is communicated with the transfer chamber 4 under vacuum, the load-lock chamber 8 is set at the same vacuum pressure as in the transfer chamber 4 while leaving the gate valves G1, G2 closed. Thereafter, the gate valve Gi is opened.

In the processing system constructed as mentioned above, a object such as a semiconductor wafer is taken out from a cassette within the cassette camber 10 in a horizontal posture, transported to the processing apparatus 6 within the system while maintaining the horizontal posture, and horizontally placed on the table within the processing apparatus 6. Therefore, each of the processing apparatus 6 and individual chambers 4, 8, 10 is designed in such a way that its foot print (its image projected on the floor surface) is larger than that of the object, in term of area. Consequently, with the increasing tendency in size of the object in recent years (for example, the size of the object (such as a semiconductor wafer) increases to 8 inches or to 300 mm in diameter), the foot prints of the processing apparatus 6 and individual chambers 4, 8, 10 are inevitably increased. As a result, the area of the processing system occupied in the clean room becomes quite large.

Since the manufacturing cost per unit area of the clean room is quite high, it is desired that the clean room must be used efficiently in consideration of the foot print. To attain this, the foot prints of the processing apparatus and the entire processing system including the processing apparatus, must be reduced as much as possible. Furthermore, in the single-wafer processing apparatus, a throughput is inevitably limited by an inherent feature of one-by-one wafer processing system.

BRIEF SUMMARY OF THE INVENTION

An object of the present invention is to provide a processing apparatus having a small foot print and high processing efficiency, a processing system and a processing method.

The aforementioned object of the present invention can be attained by the processing apparatus and the processing system mentioned below. To be more specific, a processing apparatus according to the present invention comprises:

a processing vessel having an inner processing space defined by a ceiling portion, a bottom portion, and side walls and capable of being evacuated to a predetermined vacuum;

a mounting table which has a first mounting surface for mounting the object thereon and a second mounting surface facing an opposite side to which the first mounting surface faces for mounting the object thereon, and which is situated in the inner processing space in such a way that the first and second mounting surfaces face the side walls of the processing vessel;

a process gas supply means for supplying a process gas to the inner processing space; and a loading/unloading portion having an opening formed in the bottom portion of the processing vessel and a gate means for opening/closing the opening, for loading/unloading the object into/from the processing vessel.

Furthermore, the processing system according to the present invention, comprises:

a transfer chamber having a ceiling portion and capable of being evacuated to a predetermined vacuum and the object is transferred therethrough;

at least one processing chamber stacked on the transfer chamber, for applying a predetermined process to the object;

a loader chamber communicably connected to the transfer chamber through a first openable door, for loading an object;

at least one setting room communicably connected to the loader chamber through a second openable door and storing a plurality of objects stacked one upon the other, in a horizontal posture;

a loader arm provided in the loader chamber and having a rotatable and foldable arm portion, and a holding mechanism rotatably attached to an end portion of the arm portion in order to orient the object held by the holding mechanism toward a horizontal direction and a vertical direction, for transporting the object between the loader chamber and the setting chamber;

a transfer arm provided within the transfer chamber and having a moving mechanism movable in the horizontal direction, an arm main body liftably attached to the moving mechanism, and two holding portions provided at an upper end of the arm main body and holding almost vertically, for transferring two objects between the loader chamber and the processing chamber while holding two objects simultaneously and substantially vertically by the holding portions, respectively, in which the processing chamber comprises a processing vessel having an inner processing space defined by a ceiling portion, a bottom portion, and side walls and capable of being evacuated to a predetermined vacuum;

a mounting table which has a first mounting surface for mounting the object thereon and a second mounting surface facing an opposite side to which the first mounting surface faces for mounting the object thereon, which is supported by the ceiling portion of the processing vessel, and which extends substantially vertically toward the bottom portion of the processing vessel in such a way that the first and second mounting surfaces face the side walls of the processing vessel; and a process gas supply mechanism, for supplying a process gas to the inner processing space;

the processing chamber being communicably connected to the transfer chamber by way of a third openable door provided between the bottom of the processing vessel and the ceiling portion of the transfer chamber.

Furthermore, the method according to the present invention comprises the steps of:

taking out a first object from a setting chamber storing a plurality of objects stacked one upon the other in a horizontally-oriented posture, by a loader arm while maintaining the horizontally-oriented posture, and loading the first object into a loader chamber next to the setting chamber;

switching orientation of the first object held by the loader arm from the horizontal posture to a substantially vertical posture, by rotating a holding mechanism of the loader arm holding the first object in a first direction;

loading the first object by the loader arm from the loader chamber to a load-lock chamber next to the loader chamber while maintaining the vertical posture, and holding the first object on a first holding surface of a holding table supported vertically in the load-lock chamber while maintaining the substantially vertical posture;

taking out a second object stored in the setting chamber by the loader arm while maintaining the horizontal posture, and loading the second object into the loader chamber;

switching an orientation of the second object held by the loader arm from the horizontal posture to substantially vertical posture by rotating the holding mechanism of the loader arm holding the second object thereon, in a second direction opposite to the first direction;

loading the second object by the loader arm from the loader chamber to the load-lock chamber while maintaining the substantially vertical posture, and holding the second object on a second holding surface opposite to the first holding surface while maintaining the substantially vertical posture;

moving up a transfer arm provided within a transfer chamber which is positioned below the load-lock chamber and the processing chamber, in a lower portion of the load-lock chamber, thereby simultaneously holding the first and second objects which are respectively held on the first and second holding surfaces of the holding table, by the transfer arm in substantially a vertical posture;

loading the first and second objects held by the transfer arm into the transfer chamber while maintaining the substantially vertical posture, by moving down the transfer arm;

moving the transfer arm horizontally within the transfer chamber to move the first and second objects to the position under the processing chamber while maintaining the substantially vertical postures of the first and second objects;

moving up the transfer arm under the processing chamber to load the first and second objects held by the transfer arm from the transfer chamber into the processing chamber while maintaining substantially the vertical posture, and mounting the first and second objects respectively on the first and second mounting surfaces positioned at both sides of the mounting table supported vertically in the processing chamber; and applying a predetermined process to the first and second objects mounted on the first and second mounting surfaces, in the processing chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, examplary embodiments of the present invention will be explained with reference to the accompanying drawings.

Figure 1:
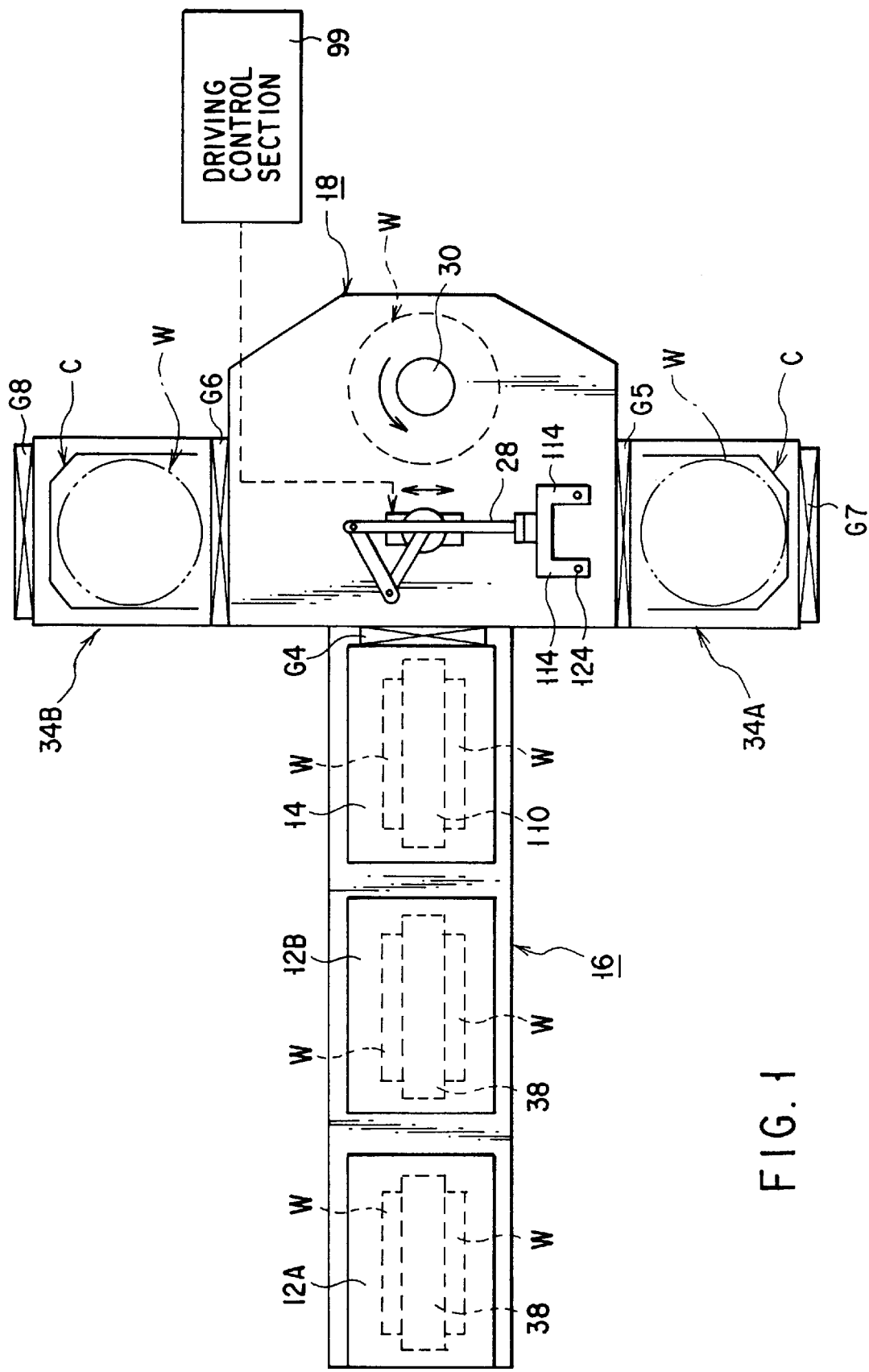
FIG. 1 is a schematic plan view of a processing system according to Embodiment 1 of the present invention.
Figure 2:
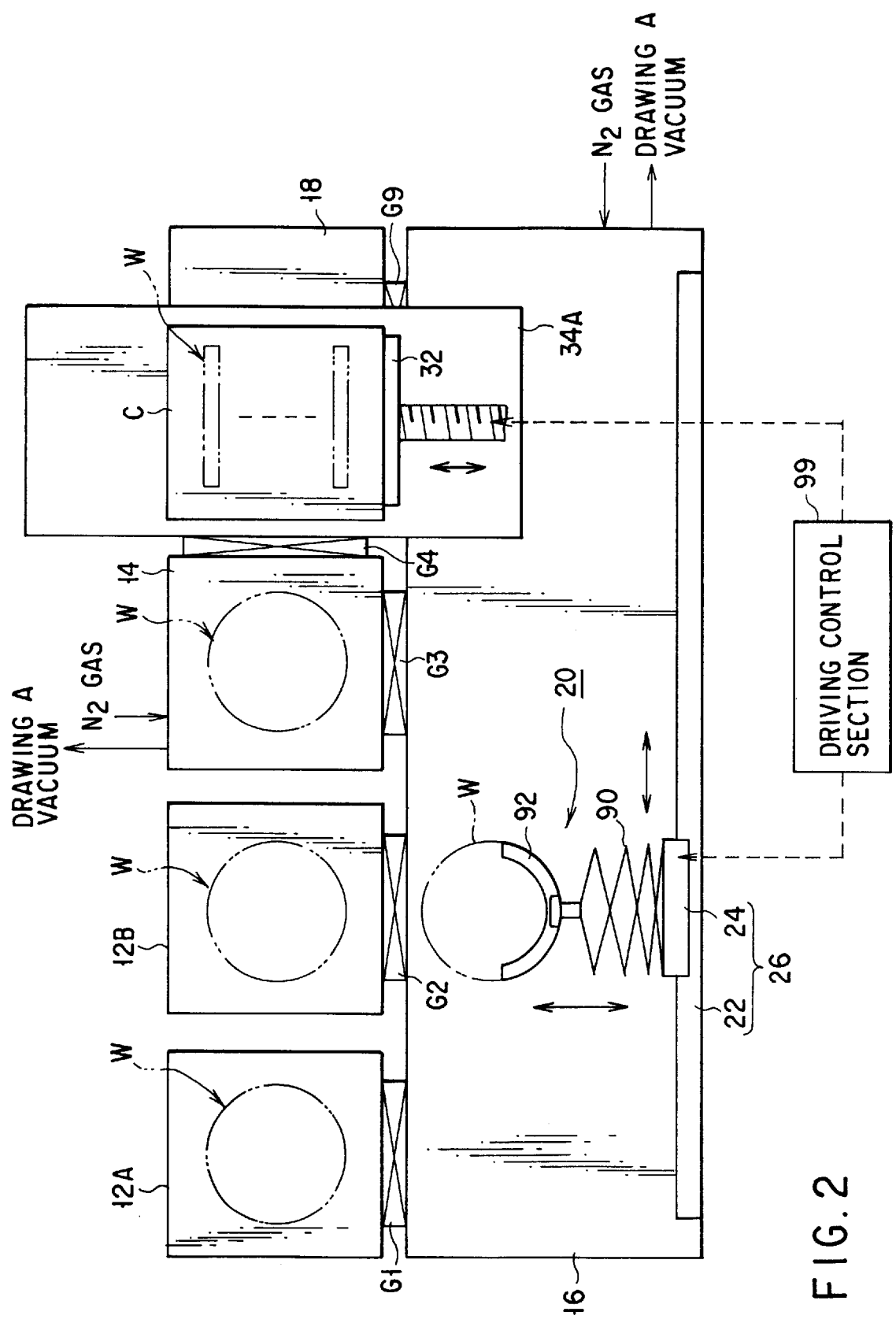
FIG. 2 is a schematic side sectional view of the processing system shown in FIG. 1.

FIGS. 1-11 show Embodiment 1 of the present invention. As shown in FIGS. 1 and 2, the processing system according to this embodiment has two film formation chambers 12A, 12B serving as a processing apparatus, a load-lock chamber 14, a loader chamber 18 for loading/unloading a wafer W into the system, a transfer chamber 16 connected to each of chambers 12A, 12B, 14, 18, and cassette chambers (setting chamber) 34A, 34B. The cassette chamber 34A, 34B house a plurality of wafers W, each horizontally oriented and vertically stacked one upon the other. More specifically, a predetermined unit number of wafers W are stored in each of the cassettes C, which are set at the cassette chambers 34A, 34B.

Two film-formation chambers 12A, 12B are formed in the same structure and arranged side by side. In the film formation chambers 12A, 12B, a thin film is formed on a substrate such as a semiconductor wafer W, by a CVD method. The load-lock chamber 14 is abutted on the side of the film-formation chamber 12B. An inner atmosphere is set by introducing an inert gas into the load-lock chamber 14 or set at a predetermined vacuum. The loader chamber 18 is connected to a side wall of the load-lock chamber 14 with the gate valve G4 interposed between them. The loader chamber 18 has a rotatable and extendible loader arm 28 for transporting the wafer W and a rotation table 30 for orienting the wafer W toward a predetermined direction. The cassette chambers 34A, 34B are connected respectively to both sides of the loader chamber 18 with the gate valves G5, G6 interposed between them. Within the cassette chambers 34A, 34B, a liftable cassette elevator 32 is provided. Openable gate doors G7, G8 are formed on side walls of the cassette chambers 34A, 34B for loading/unloading the cassette C with a plurality of wafers W stored therein. The transfer chamber 16 is arranged under the chambers 12A, 12B, 14, 18, which are positioned side by side, and extends along all the chambers. The transfer chamber 16 is formed, for example, of aluminum. An inert gas such as $N_2$ gas is introduced into the transfer chamber 16, or the inner atmosphere of the transfer chamber 16 is set at a predetermined vacuum. The transfer chamber 16 is connected to the chambers 12A, 12B, 14, 18 via gate valves G1, G2, G3, G9, respectively. Note that the transfer chamber 16 has a transfer arm 20 capable of transferring the wafer W between the chambers 12A, 12B, 14, 18.

Figure 3:
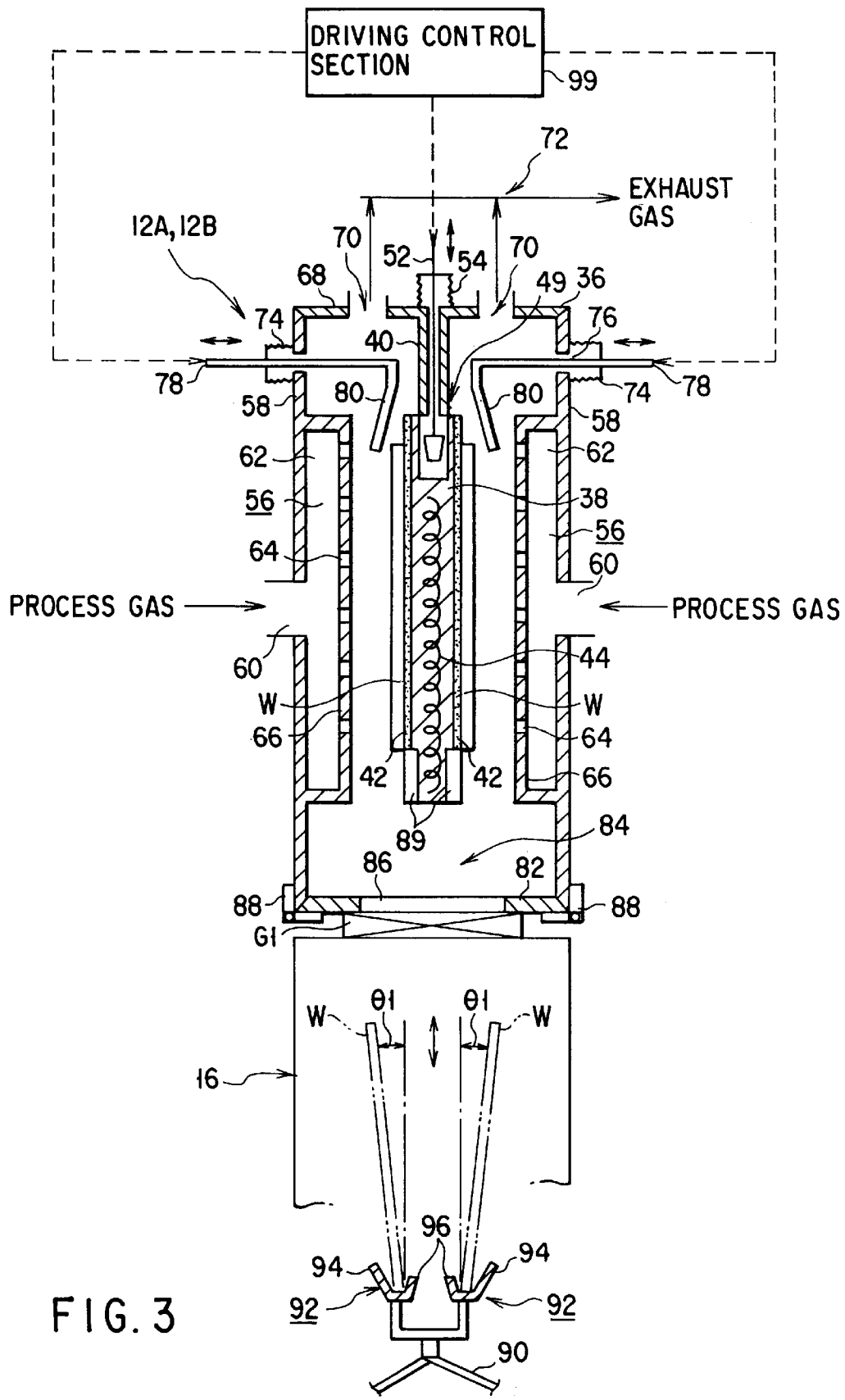
FIG. 3 is a side sectional view of a processing apparatus (film formation chamber) constituting the processing system shown in FIG. 1.

FIG. 3 shows a detailed structure of the film formation chambers 12A (12B). The film formation chamber 12A (12B) has a processing vessel 36 which is vertically long and made of aluminium. The vessel 36 has a ceiling portion 68, a bottom portion 82 and a side portion to define an inner processing space. The side portion includes two wider side walls 58 and two narrower side walls. The two wider side walls are substantially parallel to each other. The height of the vessel is larger than the width of the narrower side wall. A loading/unloading portion 84 is formed at a bottom 82 of the processing vessel 36 for loading/unloading the wafer W into/from the processing vessel 36. More specifically, the loading/unloading portion 84 consists of a loading/unloading port 86 formed at the bottom 82 and the gate valve G1 for opening/closing the. loading/unloading port 86. When the gate valve G1 is opened, the processing vessel 36 communicates with the transfer chamber 16. On the contrary, when the gate valve G1 is closed, the communication between the processing chamber 36 with the transfer chamber 16 is shut out.

In the processing vessel 36, a vertical mounting table (susceptor) 38 is arranged which is formed virtually circular and made of, for example, ceramic. The vertical mounting table 38 has wafer mounting surfaces arranged at both sides, respectively. The vertical mounting table 38 is arranged vertically in such a way that each of the wafer mounting surfaces faces the wider side wall 58 of the processing vessel 36. To ensure the space for loading/unloading the wafer W through the loading/unloading port 86, at the bottom 82, the vertical mounting table 38 is suspended from the ceiling portion 68 of the processing vessel 36 by means of a support pipe 40. The diameter of the vertical mounting table 38 is set at a value slightly larger than that of the wafer W. Two mounting surfaces of the vertical mounting table 38 form the electrostatic chuck 42 capable of adsorbing and holding the wafer by means of the coulomb force. The electrostatic chuck 42 is formed by burying, for example, a conductive thin film, into a ceramic board or a polyimide resin. Within the vertical mounting table 38, a heating means such as a heater 44, is provided for heating the wafer W to a desired temperature. As the heater 44, for example, a ceramic heater or the like is used.

Figure 4:
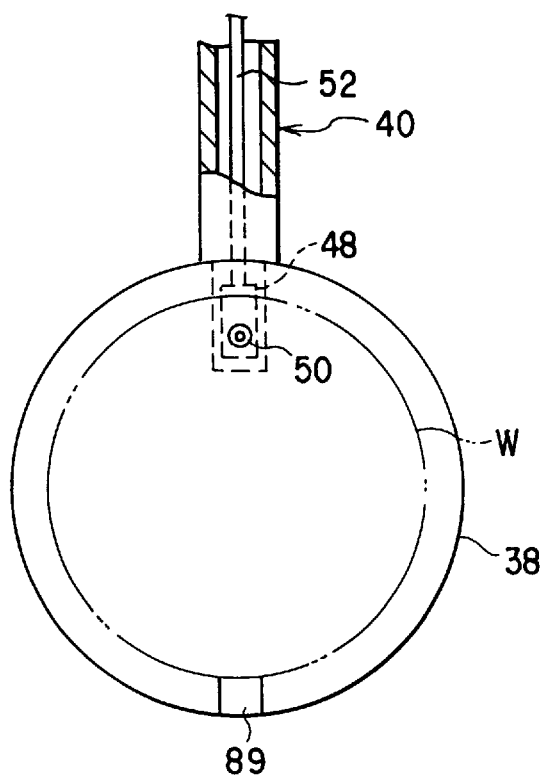
FIG. 4 is a front view of a vertical mounting table provided in the processing apparatus shown in FIG. 3.
Figure 5:
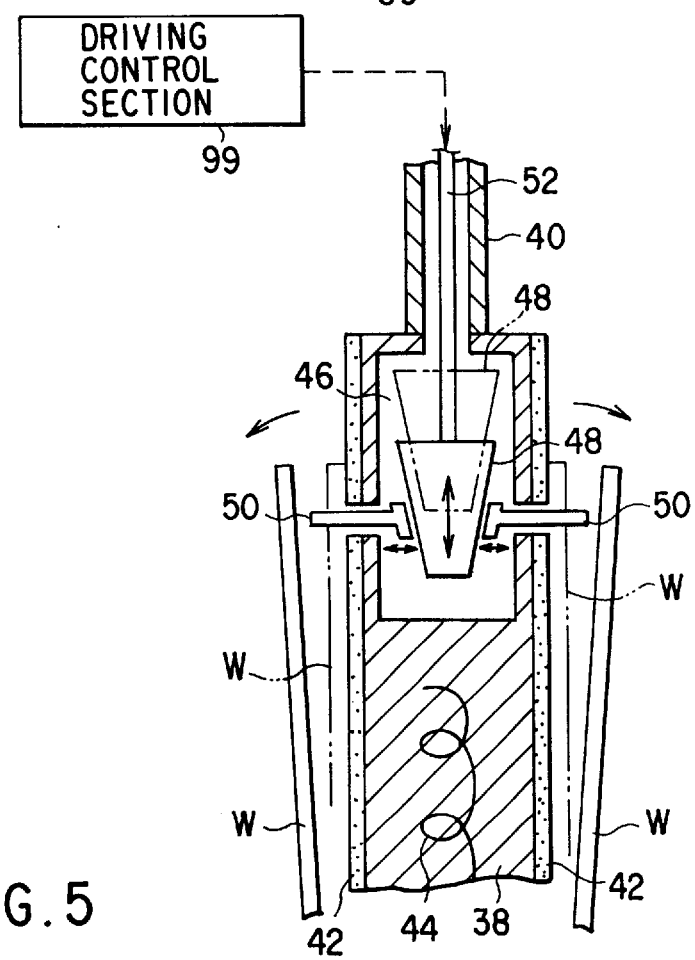
FIG. 5 is a magnified sectional view of vertical mounting table equipped with a dechuck(chuck-release) mechanism.

A dechuck mechanism 49 is provided for releasing the wafer W from adhesion force due to residual charge on the electrostatic chuck 42 in an upper portion of the vertical mounting table 38. As shown in FIGS. 4 and 5, the dechuck mechanism 49 has a wedge-form push member 48 and two push pins 50, 50 capable of projecting and depressing from each of the mounting surface of the vertical mounting table 38. The push member 48 is housed in a hollow chamber 46 formed on the upper portion of the vertical mounting table 38. The push member 48 is connected to a push rod 52 serving as an actuation member and inserted through the support pipe 40. The push member 48 moves up and down by reciprocal movement of the push rod 52 controlled by a driving control section 99. Each of the push pins 50, 50 are extended from the hollow chamber 46 sideward so as to thread through the vertical mounting table 38. When the push member 48 is moved down, each of push pins 50, 50 is pushed sideward in its entirety while one end of each of the push pins 50 located in the hollow chamber 46 is in contact with a taper-form outer surface of the push member 48. As a result, the other end of the push pin 50 is forced to protrude outward from the corresponding mounting surface of the vertical mounting table 38. In this occasion, if the wafer W is adsorbed on the mounting surface by means of the residual charge of the electrostatic chuck 42, the wafer W is forcibly removed from the mounting surface by the push pins 50 which is protruded from the mounting surface. Note that the other end of the push pin 50 protruding from the mounting surface is pushed down by the rear surface of a newly-mounted wafer W when a new wafer W is adsorbed on the electrostatic chuck 42 (mounting surface) and retracted in the hollow chamber 46.

As shown in FIG. 3, the upper portion of the push rod 52 is attached airtight to the ceiling portion 68 of the processing vessel 36 by means of an expandable bellows 54 in order to set the atmosphere of the processing vessel 36 at a predetermined vacuum. More specifically, the bellows 54 is connected airtight to the upper portion of the push rod 52 and to the ceiling 68 of the processing vessel 36. The bellows 54 is expanded vertically along with the up-and-down motion of the push rod 52 threading through the bellows 54 airtight.

To supply a predetermined gas uniformly to the surface of the wafer W mounted on the mounting surface of the vertical mounting table 38, a process gas supply mechanism is provided on the side wall 58 of the processing vessel 36, for supplying a process gas to each of the mounting surfaces of the vertical mounting table 38.

In this embodiment, the process gas supply mechanism consists of two shower heads 56, 56 provided at both side walls of the processing vessel 36 respectively so as to face the corresponding mounting surfaces of the vertical mounting table 38. Needless to say, the process gas supply mechanism may be constituted of one shower head provided on the side wall 58 so as to face two mounting surfaces. Each of the shower heads 56 has a gas spray board 66 positioned so as to face the mounting surface of the vertical mounting table 38 and having numerous minute gas holes 64. A gas dispersion chamber 62 having a gas inlet 60 is formed between the side wall 58 of processing vessel 36 and the spray board 66. The gas inlet 60 of each of the shower heads 56 is connected to a common gas source (not shown) by way of a gas supply pipe (not shown). A gas controlled in flow amount is supplied from the gas source. Note that a dispersion plate may be provided within the gas dispersion chamber 62 in order to facilitate the gas dispersion in the dispersion chamber 62.

A gas outlet 70 is formed in the ceiling 68 of the processing vessel 36. To the gas outlet 70, a vacuum evacuation system 72 equipped with a vacuum pump (not shown) is connected so as to evacuate the processing vessel 36. A through hole 76 is formed in each of the upper portion of both side walls 58 of the processing vessel 36. Through each of the through holes 76, a sliding rod 78 is slidably inserted. To maintain the atmosphere of the processing vessel 36 at a predetermined vacuum, an end portion of the sliding rod 78 protruding outside of the processing vessel 36 through the through hole 76, is fitted airtight to the side wall 58 of the processing vessel 36 through the expandable bellows 74. More specifically, the bellows 74 is connected to one end of the sliding rod 78 and the side wall 58 of the processing vessel 36, airtight. The bellows 74 is expanded along with the sliding movement of the sliding rod 78 which threads through the bellows 74 airtight. To the other end of the sliding rod 78 located within the processing vessel 36, a clamp member 80 is attached. When the sliding rod 78 is inserted into the processing vessel 36, the clamp member 80 comes into contact with the peripheral portion (upper end portion) of the wafer W oriented almost vertically to push the wafer W against the mounting surface of the vertical mounting table 38. The sliding operation of the sliding rod 78 is controlled by the driving control section 99. Note that the tip of the clamp member 80 is bent outwardly away from the wafer W so as not to damage a mirror surface of the wafer W when it comes into contact with the wafer W.

Figure 11:
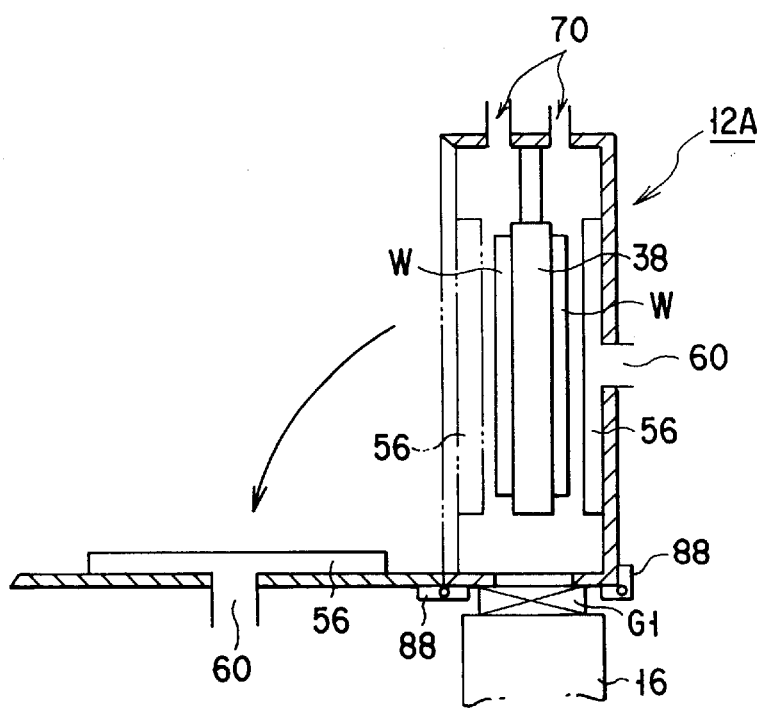
FIG. 11 is a sectional view of the processing apparatus shown in FIG. 3 with a side wall opened.

As described later, the wafer W is transferred between the film formation chambers 12A, 12B and the transfer chamber 16 by the transfer arm 20, which moves up and down through the loading/unloading portion 84. To prevent interference between the transfer arm 20 and the vertical mounting table 38, relief portions 89 in the form of a recess are formed at both sides of the lower portion of the vertical mounting table 38, for allowing the engage pieces 96 of the holding portion 92 of the transfer arm 20 to overlap with the lowest portion of the mounting table 38 when the transfer arm 20 moves up. Each of the two side walls 58 facing each other of the processing vessel 36 equipped with the shower head 56 is connected to the bottom portion 82 of the processing vessel 36 by means of a hinge 88. Accordingly, if the side wall 58 is opened outwardly around the hinge 88 at an angle of about 90° as shown in FIG. 11, the maintenance operation of the processing vessel 36 can be easily made.

As shown in FIG. 2, the transfer arm 20 provided in the transfer chamber 16 has a horizontal moving mechanism 26 which consists of a guide rail 22 and a moving body 24 moving along the guide rail 22. Therefore, transfer arm 20 can move horizontally. As the horizontal moving mechanism 26, for example, a liner motor, a liner ball screw, or the like may be employed. As shown in FIG. 3, the transfer arm 20 has an arm main body 90 fixed on the moving body 24 and movable up and down, and two holding portions 92, 92 fixed at the upper ends of the arm main body 90. By virtue of the two holding portions 92, 92, two wafers W can be held and transferred at the same time. In this embodiment, the two holding portions 92, 92 are arranged oppositely in a mirror-image position (see FIG. 3). Note that the expansion/contraction movement of the transfer arm 20 and the driving operation of the horizontal moving mechanism 26 are controlled by the drive controller 99.

Figure 6:
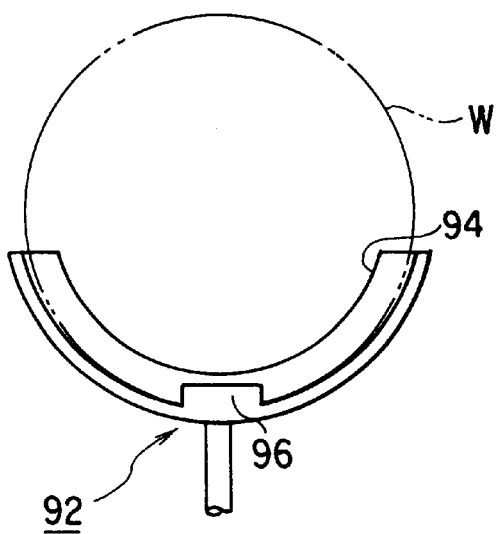
FIG. 6 is a side view showing a gist portion of a transfer arm arranged within the transfer chamber constituting the processing system shown in FIG. 1.
Figure 7:
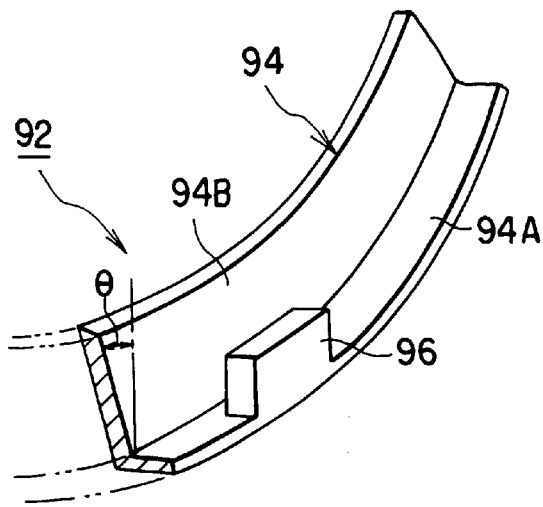
FIG. 7 is a magnified perspective view of a gist portion of the transfer arm shown in FIG. 6, partly broken away.

As shown in FIGS. 6 and 7, each of the holding portions 92, 92 has a mounting plate 94 having virtually a semi-circle plan shape and virtually an L-shape sectional shape, and an engage piece 96 protruding upward from the lowest end of the mounting plate 94. The mounting plate 94 is constituted of a mounting surface 94A having substantially the same curvature as the arc of the wafer W, for mounting the wafer W almost vertically thereon, and a supporting surface 94B for supporting the peripheral portion of the wafer W by one side thereof. In this case, the supporting surface 94B is formed so as to slightly open outwardly at an angle of 90+θ° with the mounting surface 94A (see FIG. 7). The engage piece 96 holds the wafer W by sandwiching its lower end portion (peripheral portion) between the engage piece 96 and the supporting surface 94B. Therefore, as shown in FIG. 3, the wafer W is held by the holding portion 92 with a posture slightly inclined by an angle of θ1 with the vertical direction. The wafer W held by one of the holding portions 92 is inclined in the opposite direction of the wafer W held by the other holding portion 92. The two wafers W are held diagonally by the holding portions 92, 92 at an interval larger than the width of the mounting table 38. The angle of θ1 is from about 2° to about 15°, and preferably from about 5° to 10°.

Figure 8:
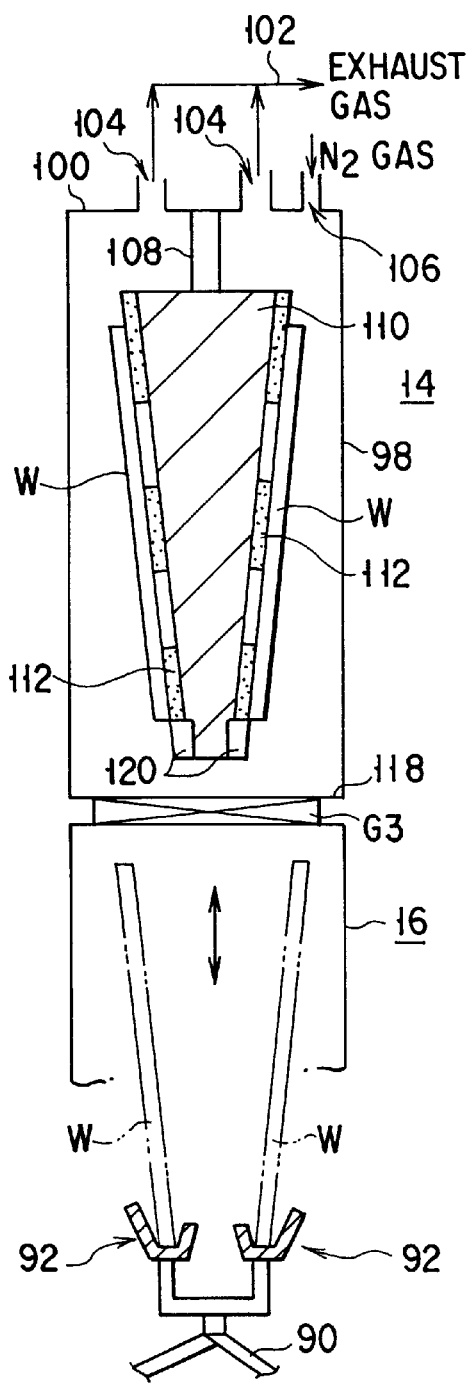
FIG. 8 is a schematic view showing constitution of the load-lock chamber constituting the process system shown in FIG. 1.
Figure 9:
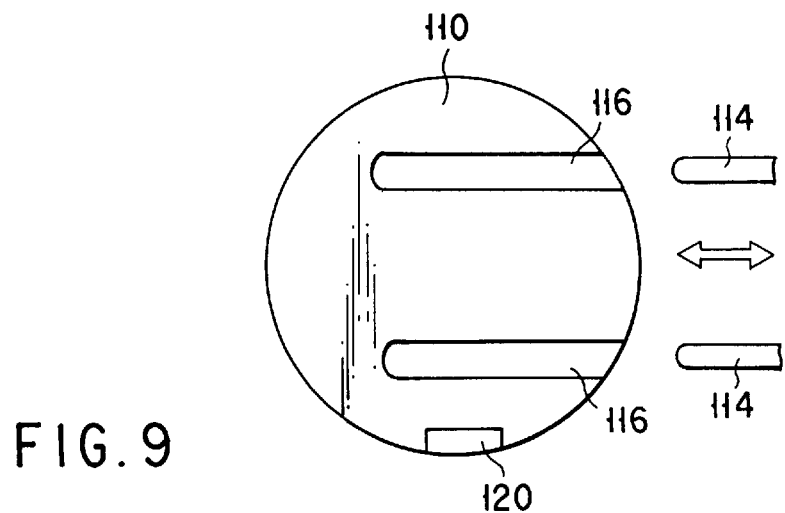
FIG. 9 is a front view of an upright holder placed within the load-lock chamber shown in FIG. 8.

FIG. 8 shows the structure of the load-lock chamber 14. As shown in the figure, the load-lock chamber 14 has an aluminum vessel 98 vertically long. The ceiling 100 of the vessel 98 has an exhaust port 104 connecting to the vacuum evacuation system 102, and a gas inlet 106 for introducing an inert gas such as $N_2$ gas. Within the vessel 98, an upright holder 110 (virtually a disk form) is arranged. The upright holder 110 has holding surfaces for adsorbing and holding the wafer W at both sides. The upright holder 110 is arranged vertically in such a way that each of the holding surfaces faces the side wall of the vessel 98. To ensure the space for loading/unloading the wafer W through the gate door G3, at the bottom portion 118, the upright holder 110 is suspended from the ceiling portion 100 of the vessel 98 by means of a support shaft 108. The two holding surfaces of the upright holder 110 are formed of an electrostatic chuck 112. The upright holder 110 has an isosceles-trapezium sectional shape. Each of the holding surfaces of the upright holder is inclined inwardly so as to be tapered off downwardly to the tip. The angle between the holding surfaces is set at virtually the same as that between the two wafers W held by the holding portions 92, 92 of the transfer arm 20.

As described later, the wafer W is transferred between the load-lock chamber 14 and the loader chamber 18 by the loader arm 28 (see FIG. 1) placed within the loader chamber 18 which moves back and forth in the horizontal direction through the gate door G4. To prevent interference between the loader arm 28 and the upright holder 110, two relief portions 116 (recess form) are horizontally formed in each holding surface of the upright holder 110. The relief portion is responsible for allowing a fork 114 of the loader arm 28 to escape in the moving direction when the loader arm 28 moves horizontally. Furthermore, the wafer W is transferred between the load-lock chamber 14 and the transfer chamber 16 by the up-and-down motion of the transfer arm 20 through the gate door G3. To prevent interference between the transfer arm 20 and the upright holder 110, relief portions 120 (recess) are provided on the both sides of the lower portion of the upright holder 110 in order to permit the engage piece 96 (described later) of the holder portion 92 of the liftable transfer arm 20 to overlap with the lowest portion of the mounting table 38.

Figure 10:
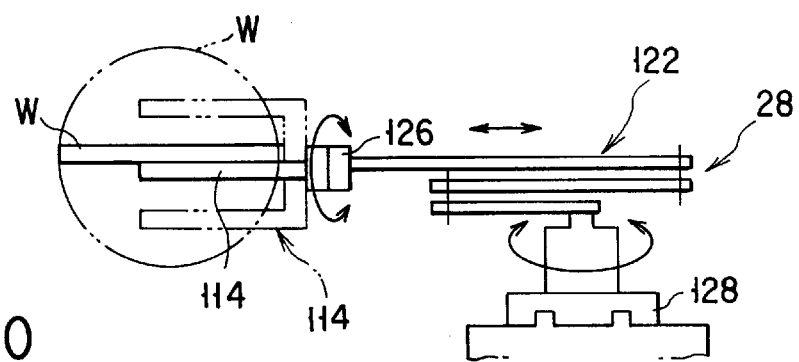
FIG. 10 is a side view of the loader arm provided in a loader chamber constituting the processing system shown in FIG. 1.

As shown in FIGS. 1 and 10, the loader arm 28 provided within the loader chamber 18 is essentially constituted of a foldable and rotatable multi-joint arm portion 122, and the fork 114 provided at the tip of the arm portion 122. The folding and rotation movement of the arm portion 122 is controlled by the drive controller 99. To adsorb the wafer W onto the fork 114, a plurality of vacuum suction holes 124 (see FIG. 1), which are connected to the vacuum evacuation system, are provided at the tip of the fork 114. A rotation shaft 126 equipped with a motor is provided between the tip of the arm portion 122 and the proximal end of the fork 114. The fork 114 can be rotated about the rotation shaft 126 with respect to the arm portion 122. The proximal end of the loader arm 28 is attached on a moving body 128 so that the loader arm 28 moves along the thickness direction of the upright holder 110.

Next, we will explain the case where a film is formed on the wafer W by use of the processing system constructed in the above.

First, an unprocessed wafer W stored in either one of the cassette chambers, for example, the cassette chamber 34A, is taken out while maintaining its horizontal posture, by the loader arm 28 in the loader chamber 18. In this case, the wafer W is vacuum adsorbed by the fork 114 of the loader arm 28 through vacuum suction holes 124. The wafer W taken out from the cassette chamber 34A by the loader arm 28 is mounted horizontally on the rotation table 30 by the rotation movement of the arm portion 122. Subsequently, alignment of the mounted wafer W for orientation flat is made. In the case of the wafer of 300 mm in diameter, alignment of the wafer for the notch is made.

After the alignment of the wafer W on the rotation table 30 is completed, the wafer W is held horizontally by the loader arm 28 once more and transferred to the load-lock chamber 14 by rotating the arm portion 122. More specifically, as shown in FIG. 10, the fork 114 is rotated in a single direction at an angle of about 90° by means of the rotatory motion of the rotation shaft 126, with the result that the wafer W held by the fork 114 is almost vertically oriented. In this case, the fork 114 is slightly inclined toward either sides from the vertical direction. The angle of inclination corresponds to that of one of the holding surfaces of the upright holder 110. The fork 114 is then positioned to face the gate door G4 by the rotatory motion of the arm portion 122. Subsequently, the arm portion 122 is extended to introduce the wafer W into the load-lock chamber 14 through the opened gate valve G4. As the arm portion 122 is extended, the fork 114 enters the two relief portions 116 formed one of the holding surfaces. In this way, the wafer W is placed in its entirety on the inclined holding surface. Then, power is supplied to the electrostatic chuck 112 in this state, the wafer W is adsorbed and held on the holding surface in a slightly inclined posture (but substantially vertical posture).

When the wafer W is adsorbed onto one of the holding surfaces in this manner, vacuum suction of the fork 114 is shut off, with the result that the wafer W is completely transferred-to the upright holder 110. Thereafter, the arm portion 122 is contracted to withdraw the loader arm 28 into the loader chamber 18. At the same time, the unprocessed wafer W stored in the cassette 34A is taken out by the loader arm 28 with maintaining the horizontal posture. The second wafer W thus taken out from the cassette chamber 34A by the loader arm 28, is aligned on the rotation table 30 in the same manner as mentioned before. Thereafter, the second wafer W is transferred to the load-lock chamber 14 by the rotatory motion of the arm portion 122. At this point, the fork 114 is rotated in another direction by the rotatory motion of the rotation shaft 126 at an angle of almost 90, with the result that the wafer W held by the fork 114 is oriented almost vertically. Another direction mentioned above is an opposite direction of the rotatory direction along which a first wafer is transferred. This is made to orient the surface of the second wafer to the direction opposite to the surface of the first wafer. Consequently, the wafer W held by the fork 114 is oriented almost vertically. In this case, the fork 114 is slightly inclined to an opposite side to the first case. The angle of inclination in this case corresponds to that of the other holding surface of the upright holder 110. When the fork 114 is set to face the gate door G4 by the rotatory motion of the arm portion 122, the loader arm 28 is slightly moved in the thickness direction of the upright holder 110 by the moving body 128 to face the other holding surface. In this state, the arm portion 122 is extended to introduce the wafer W into the load-lock chamber 14 through the opened gate valve G4. As the arm portion 122 is extended, the fork 114 enters into two relief portions 116 formed in the other holding surface. In this manner, the wafer W is placed on the holding surface inclined in its entirety. When power is supplied to the electrostatic chuck 112, the wafer W is adsorbed and held on the holding surface in a slightly inclined posture.

When two wafers are held on the upright holder 110 in a substantially vertical posture, the gate valve G4 is closed and a vacuum is produced in the load-lock chamber 14. When the pressure of the load-lock chamber 14 is set at the virtually the same pressure of the transfer chamber 16 which has been set at a predetermined vacuum, the gate valve G3 is opened to communicate the load-lock chamber 14 with the transfer chamber 16. Subsequently, the horizontally-moving mechanism 26 is driven to position the transfer arm 20 (provided in the transfer room 16) under the gate door G3 (see FIG. 8). Then, the arm main body 90 is extended, so that two semicircular holding portions 92, 92 are moved up and each of the lower end portions of two wafers W held by the upright holder 110 is supported between the mounting plate 94 of the holding portion 92 and the engage piece 96 (see FIG. 6). In this case, the engage piece 96 of the holding portion 92 enters the relief portion 120 formed at the lower end portion of the upright holder 110, thereby preventing the interference with the upright holder 110. When two wafers W are supported at the holding portions 92, 92, power supply to the electrostatic chuck 112 of the upright holder 110 is shut off, with the result that two wafers W are released from the holding surface and transferred to the transfer arm 20, completely.

When the two wafers W are thus transferred to the transfer arm 20, the arm main body 90 is contracted, thereby taking two wafers W into the transfer chamber 16. Subsequently, the horizontally moving mechanism 26 is driven to move the transfer arm 20 to, for example, the film formation chamber 12A. Two wafers W are stably moved while the posture (upright posture slightly inclined outwardly) inclined by an angle of θ1 with the vertical direction is maintained by the holding portions 92, 92, as shown in FIGS. 3 and 8.

When the transfer arm 20 is positioned below the gate door G1 of the film formation chamber 12A (see FIG. 3), the gate valve G1 is opened and the arm main body 90 is extended again. It follows that two wafers W held at the holding portions 92 are moved up and introduced into the processing vessel 36 through the opened gate valve G1. When the arm main body 90 is extended until the engage pieces 96 of the holding portions 92 enter into the relief portions 89 formed at the lower end of the vertical mounting table 38, two wafers W, in its entirety, are allowed to face the corresponding mounting surfaces of the vertical mounting table 38. Furthermore, at this point, the sliding rods 78 provided at the upper portion of the side wall 58 of the processing vessel 36 are pushed inwardly, with the result that the clamp member 80 comes in contact with the upper end portion of the wafer W provided at the tip of the sliding rod 78. In this manner, each wafer is pushed against the corresponding mounting surface. Then, power is supplied to the electrostatic check 42 forming the mounting surface, whereby two wafers W is adsorbed and held onto the mounting surface by means of the coulomb force in a vertical posture.

When the two wafers W are adsorbed and held on the vertical mounting table 38 in this manner, the arm main body 90 is contracted again to withdraw the transfer arm 20 into the transfer chamber 16. Thereafter, the gate valve G1 is closed and the film formation is initiated within the film formation chamber 12A.

In the film formation step, the inner atmosphere of the processing chamber 36 is set at a predetermined vacuum (processing pressure) and maintained the same. Furthermore, each of the wafers W on the mounting surfaces is heated and maintained at a predetermined processing temperature (e.g., about 300 to 600° C.) by the heater 44. At the same time, a predetermined process gas controlled in the flow amount is sprayed from two shower heads 56 (which faces the corresponding mounting surfaces) uniformly to the wafer W. While the film formation is performed in the film formation chamber 12A, two wafers W are also loaded into the other film formation chamber 12B and film formation is made in the same manner as mentioned above, therein.

After the film formation is completed in the film formation chamber 12A, the gate valve G1 is opened and the arm main body 90 is extended again. It follows that the holder portions 92 are introduced into the processing chamber 36 through the gate valve G1. When the arm main body 90 is extended until the engage pieces 96 of the holding portions 92 enter the relief portions 89 formed on the vertical mounting table 38, the extending operation of the arm main body 90 is terminated. At this time, power supply to the electrostatic chuck 42 is terminated. However, charge remains on the electrostatic chuck 42 even if the power supply is shut off, so that the wafer W remains adsorbed and held on the electrostatic chuck 42. Then, to remove the wafer W from the electrostatic chuck 42, the push rod 52 of the dechuck mechanism 49 is moved down as shown in FIG. 5, thereby moving down the taper-form push member 48. It follows that the push member 48 comes into contact with one end of each of the two push pins 50, 50, with the result that the other end of each of the push pins 50, 50 protrudes from the mounting surface of the vertical mounting table 38 to remove the wafer W therefrom. The wafer W removed from the electrostatic chuck 42 is held by two holding portions 92 of the transfer arm 20 which has been standing-by at the moved-up position. Then, the arm main body is contracted to introduce two processed wafers W held by the holding portions 92 into the transfer chamber 16. Thereafter, a series of steps for loading the wafer W into the system explained above is carried out in completely reverse order. In this way, the processed wafer W is stored in the cassette C within the cassette chamber 34B through the load-lock chamber 14 and the loader chamber 18.

As explained in the foregoing, in the film formation chambers 12A, 12B of this embodiment, the vertical mounting table 38 is arranged vertically in such a way that each of the mounting surface on which the wafer W is to be mounted, is to face the side wall 58 of the processing vessel 36. Two shower heads 56 for supplying a process gas to the wafer W on the mounting surface are vertically arranged on the side wall 58 of the processing vessel 36 so as to face the corresponding mounting surfaces of the vertical mounting table 38. It is therefore possible in the film formation chambers 12A, 12B, to drastically reduce the foot print, in comparison with the processing chamber having a mounting table horizontally arranged therein. Similarly, in the load-lock chamber 14, the upright holder 110 is vertically arranged in such a way that each of the wafer holding surfaces for holding the wafer W, faces the side wall of the vessel 98. It is therefore possible, in the load-lock chamber 14, to drastically reduce the foot print in comparison with the chamber having a holder arranged horizontally therein.

In the processing system of this embodiment, the wafer W is transferred between chambers 12A, 12B, 14, 16, 18 while being held vertically by each of arms 20, 28. It is therefore possible to significantly reduce the entire foot print in the processing system of this embodiment, compared to the system in which the wafer is transferred by the arm held horizontally.

In the processing system of this embodiment, loading/unloading ports (gate doors G1, G2, G3) for the wafer W are formed in the bottom portion of the film-formation chamber 12A, 12B and the load-lock chamber 14 to arrange the film-formation chamber 12A, 12B and load-lock chamber 14 above the transfer chamber 16. At the same time, the vertical holder 38 and the upright holder 110 are suspended from the ceiling portion of each of the chambers 12A, 12B, 14 to ensure the space for loading/unloading the wafer W through the loading/unloading port in each of the chambers 12A, 12B, 14. If the chambers constituting the process system are vertically stacked one upon the other instead of stacking them side by side, the entire foot print is drastically reduced. It is considered possible that the film formation chambers 12A, 12B and the load-lock chamber 14 are arranged under the transfer chamber 16 by forming the loading/unloading port for the wafer W at the ceiling of each of the chambers 12A, 12B, 14. However, in this case, it is necessary to device a means for preventing the wafer W from falling at the time the wafer W is transferred from the transfer chamber 16 to the film formation chambers 12A, 12B and the load-lock chamber 14. However, this case is not preferable since the structure will be complicated.

Furthermore, in the processing system of this embodiment, the wafer W is transferred between the chambers 12A, 12B, 14 while being held the holding portion 92 of the transfer arm 20 in a posture slightly inclined to the vertical direction. More specifically, the wafer W is transferred while the lower portion of the wafer W is being sandwiched between the engage piece 96 forming the holding portion 92 and the mounting plate 94, and the peripheral portion of the wafer W is partially supported by the supporting surface 94B of the mounting plate 94. Therefore, the mirror surface of the wafer W is not damaged when the wafer W is transported. If the wafer W is transferred while holding the wafer W vertically, the mirror surface of the wafer W may be damaged during transfer time since the contact area between the wafer and the supporting means for holding the wafer vertically, should be larger.

In the processing system of this embodiment, the transfer arm 20 has two holding portions 92, 92 and the vertical mounting table 38 and the upright holder 110 have two mounting surfaces and two holding surfaces, respectively. It is therefore possible to simultaneously transfer and process two wafers W. As a result, the throughput is improved up to almost double in comparison with the single-wafer processing apparatus conventionally used.

In the film formation chambers 12A, 12B of this embodiment, two side walls 58 of the processing vessel 36 facing each other and having the shower head 56 formed thereon, are connected to the bottom portion 82 of the processing vessel 36 by means of the hinge 88. If the side walls 58 are opened outward at an angle of, for example, about 90° around the hinge 88, as shown in FIG. 11, it is possible to perform the maintenance operation for the processing vessel 36, easily and quickly.

In the processing system of this embodiment, the wafers W are stored by being vertically stacked one upon the other in the cassette C of the cassette chambers 34A, 34B in a horizontally-oriented posture in the cassette C. The wafer W is taken out from the cassette chambers 34A, 34B by the loader arm 28 present in the loader chamber 18 while keeping the horizontal posture. If the wafers W are stored by stacking one upon the other horizontally in the cassette chambers 34A, 34B as mentioned, the foot print of the cassette chambers 34A, 34B can be reduced. However, if the wafers W each oriented in the vertical direction (that is, the wafers stands on one edge) are set side by side in the cassette chambers 34A, 34B, the wafers W are required to be arranged at a predetermined pitch. Therefore, the foot print of the cassette chamber in this case is larger than this embodiment containing the same number of the wafers W.

Figure 12:
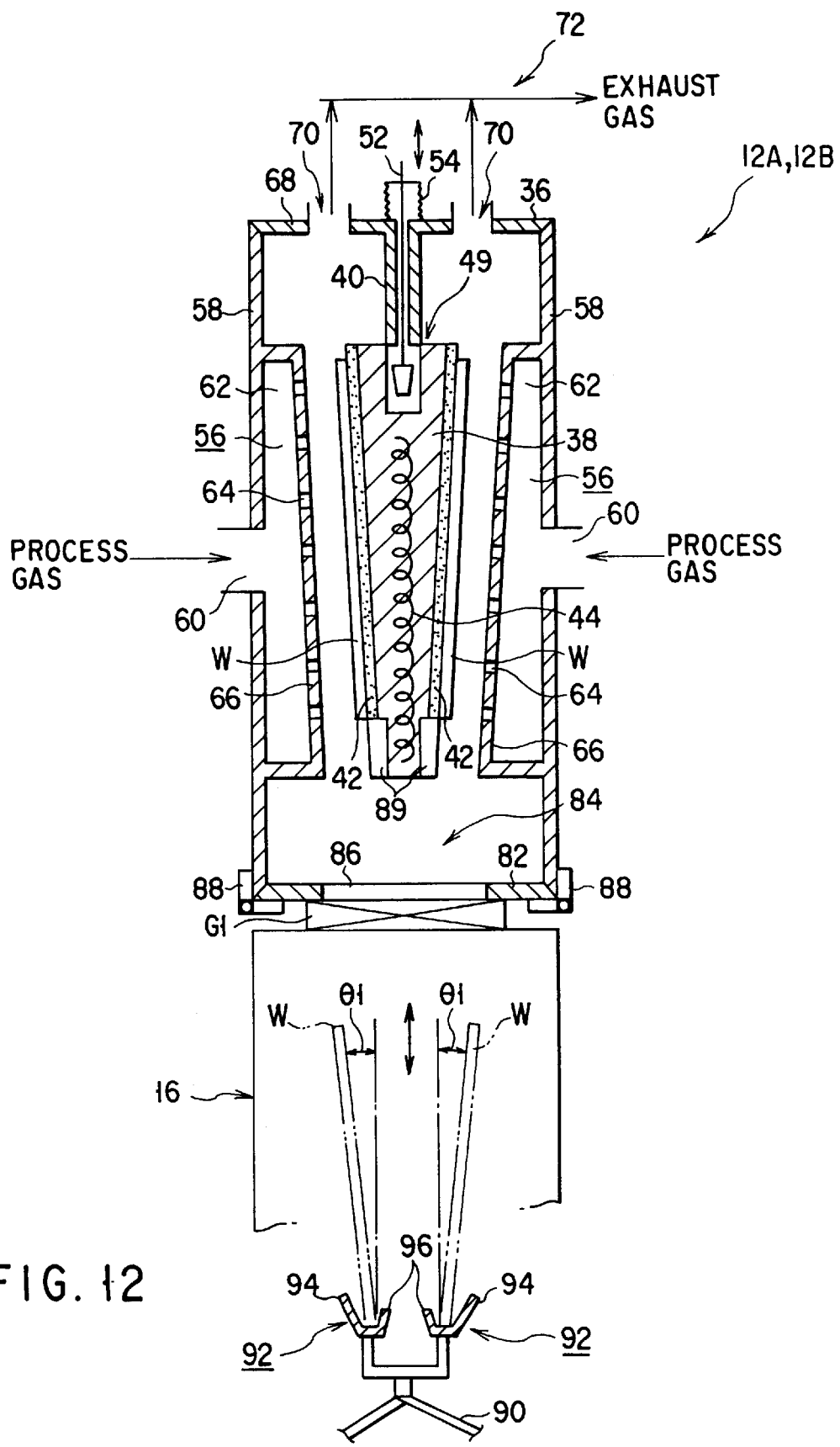
FIG. 12 is a side sectional view of a processing apparatus according to Embodiment 2 of the present invention.

FIG. 12 shows the film formation chambers 12A, 12B according to Embodiment 2 of the present invention. In the film formation chambers 12A, 12B of this embodiment, the vertical mounting table 38 has the same shape of the upright holder 110 of the load-lock chamber 14. More specifically, the vertical mounting holder 38 has an isosceles trapezium sectional form. Each of the mounting surfaces of the vertical mounting holder 38 are inclined inwardly and tapered off downwardly to the tip. The open angle formed between the mounting surfaces is set at substantially the same as that of two wafers held by the holding portions 92, 92 of the transfer arm 20. The shower heads 56, 56 for supplying a process gas to the wafer W placed on the mounting surface are extended diagonally at the same inclination angle as that formed between the mounting surfaces facing thereto.

According to the constitution of this embodiment, the open angle formed between the mounting surfaces is the same as that of two wafers W held by the holding portions 92, 92 of the transfer arm 20. As a result, the sliding rod 78 and the clamp member 80 are not required, so that the chambers can be constructed more simply.

Figure 13:
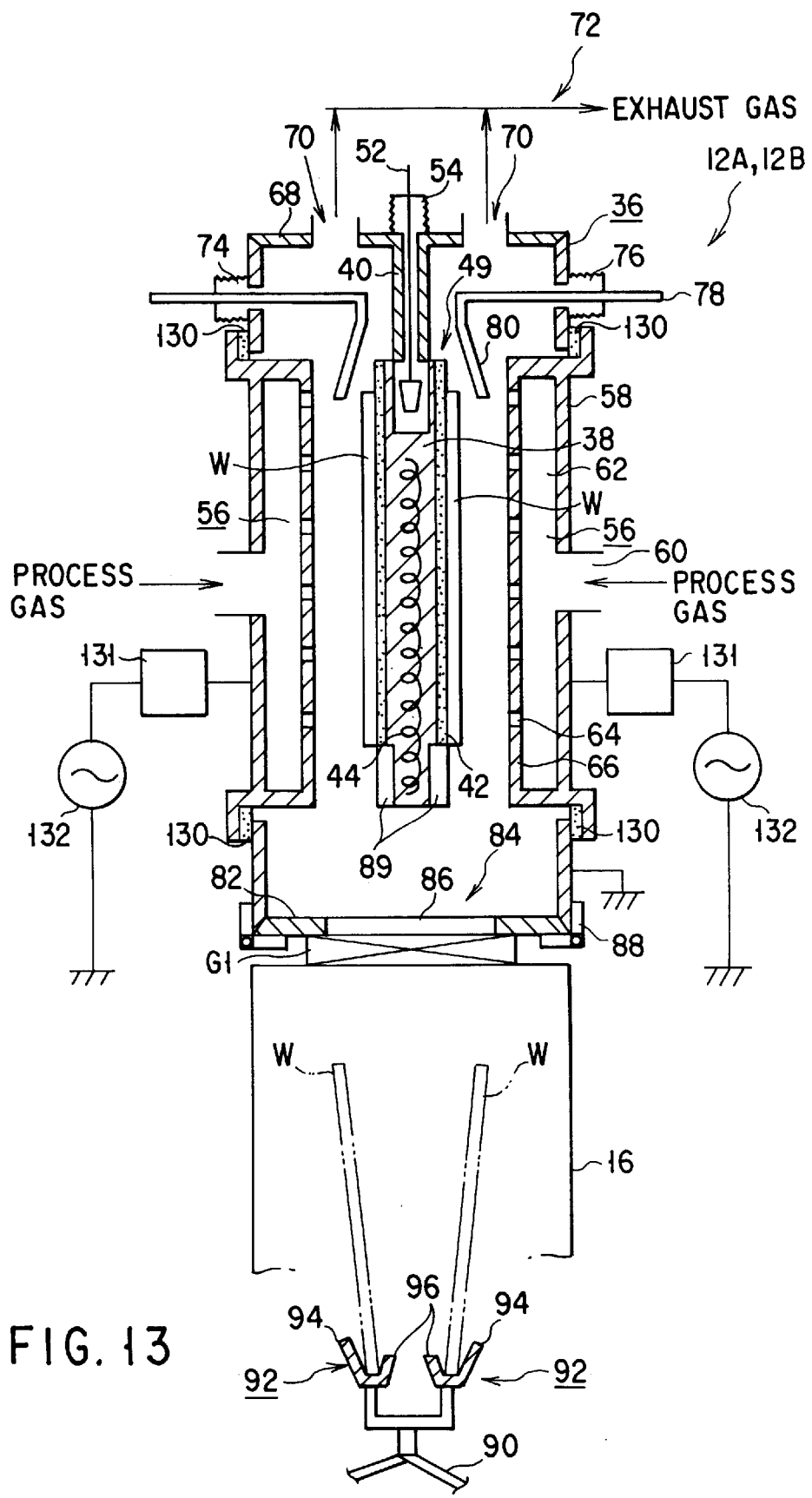
FIG. 13 is a side sectional view of a processing apparatus according to Embodiment 3 of the present invention.
Figure 14:
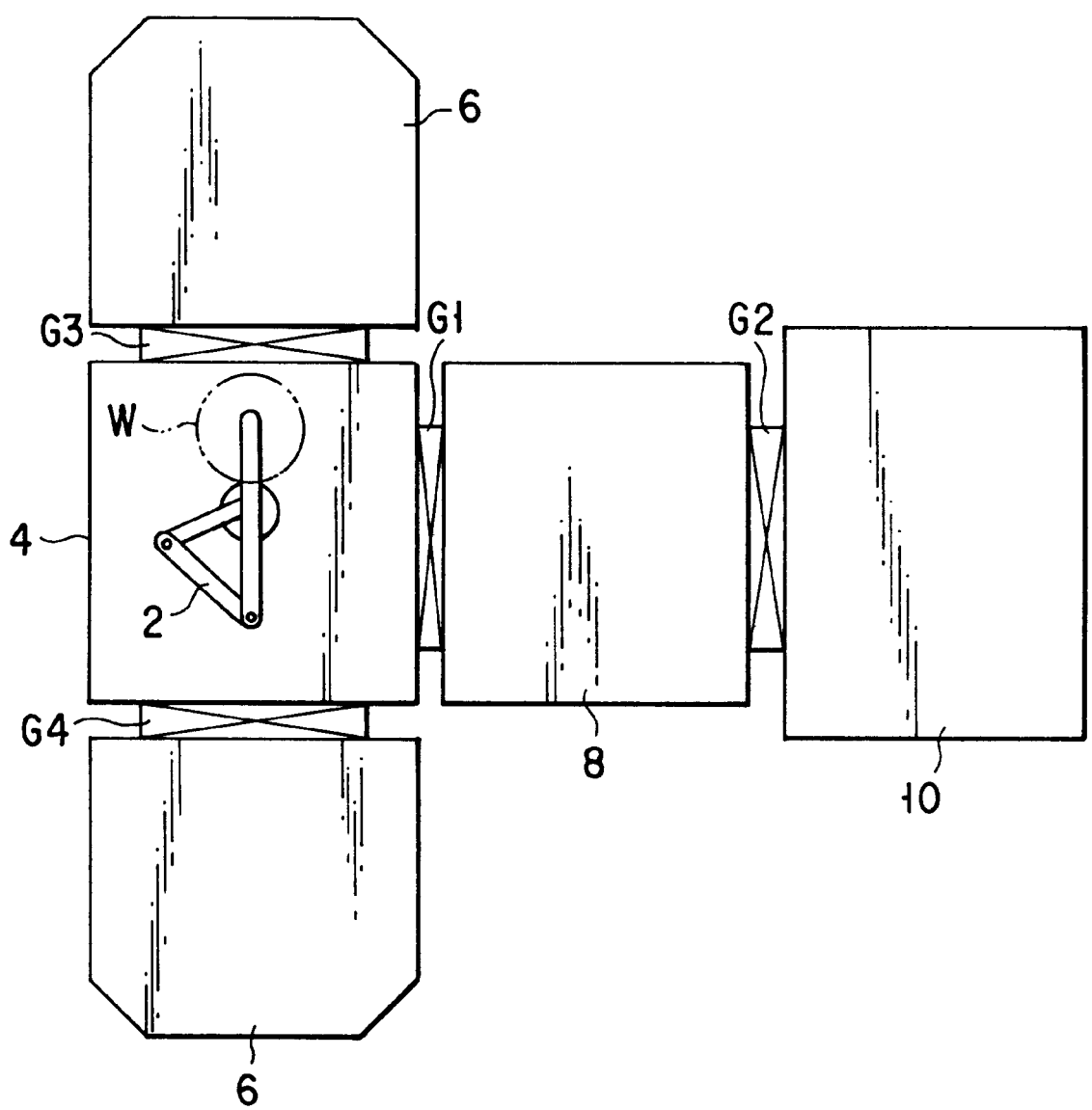
FIG. 14 is a plan view of a processing system.

FIG. 13 shows the film-formation chambers 12A, 12B according to Embodiment 3 of the present invention. In the film formation chambers 12A, 12B of this embodiment shown in the figure, the vertical mounting table 38 is grounded via the processing vessel 36 and each of the shower heads 56 is attached to the side wall 58 with an insulating material 130 interposed between them. To each shower head 56, a high frequency source 132 (e.g., 13.56 MHz) for plasma generation is connected via a matching circuit 131 in order to generate a plasma at both sides of the vertically mounting table 38. (In this case, a high frequency voltage may be applied to the table 38.) More specifically, the film formation chambers 12A, 12B of this embodiment are constituted as a plasma film formation processing apparatus.

Note that the present invention is not limited to the aforementioned embodiments and may be modified in various ways within the scope of the gist of the present invention. For example, in Embodiment 1, the wafers W are taken out from the cassette chamber 34A one by one by the loader arm 28. However, two wafers W may be taken out simultaneously from the cassette chamber 34A by the loader arm 28 by providing two rotatable forks 114 at the arm 122 of the loader arm 28.

In Embodiment 1, the wafer W is transferred to the transfer chamber 16 from the loader chamber 18 by way of the load-lock chamber 14. However, the wafer W may be transferred from the loader chamber 18 to the transfer chamber 16 directly without passing through the load-lock chamber 14. In this case, the wafer W is introduced from the loader chamber 18 into the transfer chamber 16 by way of the gate door G9. Furthermore, to maintain the film formation chambers 12A, 12B always at a predetermined vacuum, the inner atmosphere of the transfer chamber 16 is interchangeably set at an atmospheric pressure or a vacuum. More specifically, when the transfer chamber 16 communicates with the loader chamber 18 under an atmospheric pressure, the transfer chamber 16 is set at the atmospheric pressure with the gate valves G1, G2, G3, G9 closed, and thereafter, the gate valve G9 is opened. On the other hand, when the transfer chamber 16 communicates with the film formation chambers 12A, 12B under vacuum, the transfer chamber 16 is set at the same vacuum as in the film formation chambers 12A, 12B with the gate valves G1, G2, G3, G9 closed. Thereafter, the gate valves G1 (G2) is opened. Now, the flow of the transfer operation will be described hereinbelow more specifically.

(1) taking out a first wafer W from the cassette chamber 34A by the loader arm 28 in a horizontal posture and loading it into the loader chamber 18;

(2) rotating the fork 114 of the loader arm 28 holding the first wafer W in a first direction to orient the first wafer W held by the lower arm 28 from the horizontal direction to the almost vertical direction;

(3) moving up the transfer arm 20 in the lower part of the loader chamber 18, thereby holding the first wafer W (held by the loader arm 28 almost vertically) by one of the holding portions 92 of the transfer arm 20, almost vertically (inclined slightly at an angle of $\theta 1$ to the vertical direction);

(4) taking out a second wafer W from the cassette chamber 34A by the loader arm 28 with the horizontal posture maintained, and loading it into the loader chamber 18;

(5) rotating the fork 114 of the loader arm 28 (holding a second wafer W) in a second direction opposite to the first direction, thereby orienting the second wafer W (held by the loader arm 28) from the horizontal direction to the almost vertical direction;

(6) holding the second wafer W (held by the loader arm 28 almost vertically) by other of the holding portions 92 of the transfer arm 20, almost vertically (inclined slightly at an angle of $\theta 1$ to the vertical direction);

(7) moving down the transfer arm 20 to load the first and second wafers W (held by the transfer arm 20) into the transfer chamber 16 with the vertical posture maintained;

(8) moving the transfer arm 20 horizontally within the transfer chamber 16 to move the first and second wafers W below the processing chamber 12A with the vertical posture maintained;

(9) moving up the transfer arm 20 below the processing chamber 12A to load the first and second wafers W (held by the transfer arm 20) from the transfer chamber 16 to the processing chamber 12A with the vertical posture maintained, and mounting the first and second wafers W respectively on the first and second mounting surfaces positioned at both sides of the mounting table 28 which is supported almost vertically in the processing chamber 12A; and

(10) forming a film on the first and second wafers W mounted respectively on the first and second mounting surfaces within the processing chamber 12A.

In Embodiment 1, two film-formation chambers 12A, 12B are formed above the transfer chamber 16. However, the number of the film formation chambers is not limited to this. Three or more film formation chambers may be provided to improve the throughput. The processing apparatus arranged on the transfer chamber 16 is not limited to the film formation chamber. For example, an oxidation/diffusion apparatus, an etching apparatus, and a sputtering apparatus may be used as the processing apparatus. In this case, it goes without saying that the mounting table to which the wafer W is to be mounted, should be vertically arranged. The substrate to be processed in the processing system of the present invention is not limited to a semiconductor wafer. For example, an LCD substrate or a glass substrate may be used. In each of the aforementioned embodiments, a circular vertical mounting table 38 is used. However, the shape of the vertical mounting table 38 is not limited to this.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A processing apparatus for applying a process to an object, comprising:

a processing vessel having an inner processing space defined by a ceiling, portion, a bottom portion, and side walls and capable of being evacuated a mounting table which has first and second mounting surfaces, which face back to back with each other, for mounting the object thereon, and which is situated in the inner processing space in such a way that said first and second mounting surfaces face the side walls of the processing vessel;

a process gas supply means for supplying a process gas to the inner processing space; and a loading/unloading portion having an opening formed in the bottom portion of the processing vessel and a gate means for opening/closing the opening, for loading/unloading the object into/from the processing vessel.

2. The processing apparatus according to claim 1, wherein the first and second mounting surfaces form an electrostatic chuck for electrostatically holding the object.

3. The processing apparatus according to claim 2, further comprising a dechuck mechanism for releasing the object from the adsorption by means of a residual charge of the electrostatic chuck.

4. The processing apparatus according to claim 3, wherein the dechuck mechanism is constituted of a plurality of push pins projecting and depressing from each of the mounting surfaces of the mounting table, a push member for pushing each of the push pins in the direction corresponding to a push pin projecting direction, and an actuating member for actuating the push member.

5. The processing apparatus according to claim 4, wherein the mounting table has a hollow chamber at its upper end portion at which the mounting table is connected to the ceiling portion of the processing vessel;

the ceiling portion of the processing vessel has a supporting portion for supporting the mounting table;

the push member is housed in the hollow chamber;

the actuating member, an end of which is connected to the push member, extends longitudinally through the supporting portion, and moves up and down to move the push member up and down within the hollow chamber;

each of the push pins threads through the mounting table in the lateral direction toward the corresponding mounting surface from the hollow chamber, and each of the push pins has one end portion projecting into the hollow chamber and the other end portion projecting and depressing from the corresponding mounting surface, and protrudes in the lateral direction when the push member comes into contact with said one end portion while descending, with the result that said other end portion projects from the corresponding mounting surface.

6. The processing apparatus according to claim 1, wherein at least one of said side walls of the processing vessel, is rotatably connected at the bottom portion of the processing vessel by means of a hinge, whereby the side walls can be opened outward.

7. The processing apparatus according to claim 1, further comprising a plasma generation apparatus for generating a plasma by applying a high frequency voltage between the mounting table and the process gas supply mechanism.

8. A processing system for processing an object by transporting the object, comprising:
- a transfer chamber having a ceiling portion and capable of being evacuated and wherein the object is transferred therethrough;
- at least one processing chamber stacked on the transfer chamber, for applying a process to the object;
- a loader chamber communicably connected to the transfer chamber through a first openable door, for loading an object;
- at least one setting room communicably connected to the loader chamber through a second openable door and storing a plurality of objects stacked one upon the other, in a horizontal posture;
- a loader arm provided in the loader chamber and having a rotatable and foldable arm portion, and a holding mechanism rotatably attached to an end portion of the arm portion in order to orient the object held by the holding mechanism toward a horizontal direction and a vertical direction, for transporting the object between the loader chamber and the setting chamber;
- a transfer arm provided within the transfer chamber and having a moving mechanism movable in the horizontal direction, an arm main body liftably attached to the moving mechanism, and two holding portions provided at an upper end of the arm main body and holding the object almost vertically, for transferring two objects between the loader chamber and the processing chamber while holding two objects simultaneously and substantially vertically by the holding portions, respectively, wherein the processing chamber comprises:
- a processing vessel having an inner processing space defined by a ceiling portion, a bottom portion, and side walls and capable of being evacuated;
- a mounting table which has first and second mounting surfaces, which face back to back with each other, for mounting the object thereon, which is supported by the ceiling portion of the processing vessel, and which extends substantially vertically toward the bottom portion of the processing vessel in such a way that said first and second mounting surfaces face the side walls of the processing vessel;
- a process gas supply mechanism, for supplying a process gas to the inner processing space;
- said processing chamber being communicably connected to the transfer chamber by way of a third openable door provided between the bottom of the processing vessel and the ceiling portion of the transfer chamber.

9. The processing system according to claim 8, further comprising:
- a load-lock chamber stacked on the transfer chamber and communicably connected to the loader chamber through a fourth openable door, for loading the object from the loader chamber,
- wherein said load-lock chamber comprises
- a vessel having an inner space defined by a ceiling portion, a bottom portion, and side walls and capable of being evacuated;
- a holding table which has first and second holding surfaces, which face back to back with each other, for holding the object thereon, which is supported by the ceiling portion of the vessel, and which extends substantially vertically toward the bottom portion of the vessel in such a way that said first and second holding surfaces face the side walls of the vessel; and
- said load-lock chamber is communicably connected to the transfer chamber by way of a fifth openable door provided between the bottom of the vessel and the ceiling portion of the transfer chamber.

10. The processing system according to claim 8, wherein each of said two holding portions of the transfer arm holds the object in a posture inclined to the vertical direction.

11. The processing system according to claim 10, wherein each of said two holding portions is constituted of
- a mounting surface for mounting a lower end of the object,
- a supporting surface extending diagonally and upwardly from one of the sides of the mounting surface and supporting a peripheral portion of the object mounted on the mounting surface, and
- an engage piece provided at the other side of the mounting surface in a stand-up posture and engaged with the lower end of the object, for sandwiching an lower end portion of the object between the engage piece and the supporting surface.

12. The processing system according to claim 10, wherein an object held by one of said two holding portions and an objet held by the other holding portion are oriented diagonally so as to open outwardly toward the ceiling portion of the transfer chamber to make a mirror image to the vertical surface.

13. The processing system according to claim 10, further comprising a clump member which is provided in a processing chamber, for holding the object while the object is being pushed upon the mounting surface of the mounting table.

14. The processing system according to claim 12, wherein
- said first and second mounting surfaces on the mounting table provided in the processing chamber, are oriented diagonally and opened upwardly and outwardly toward the ceiling portion of the processing chamber so as to form a mirror image to the vertical surface, and the open angle formed between the first and second mounting surfaces is almost the same as an open angle formed between the objects held by the holding portions of the transfer arm.

15. The processing system according to claim 12, further comprising:
- a load-lock chamber stacked on the transfer chamber and communicably connected to the loader chamber through a fourth openable door, for loading the object from the loader chamber,
- wherein said load-lock chamber comprises:
- a vessel having an inner space defined by a ceiling portion, a bottom portion, and side walls and capable of being evacuated;
- a holding table which has first and second holding surfaces, which face back to back with each other, for holding the object thereon, which is supported by the ceiling portion of the vessel, and which extends substantially vertically toward the bottom portion of the vessel in such a way that said first and second holding surfaces face the side walls of the vessel; and
- said load-lock chamber is communicably connected to the transfer chamber by way of a fifth openable door provided between the bottom of the vessel and the ceiling portion of the transfer chamber, said first and second holding surfaces on the holding table are oriented diagonally and opened outwardly toward the ceiling portion of the vessel so as to form a mirror image to the vertical surface, and the open angle formed between the first and second holding surfaces is almost the same as an open angle formed between the objects held by the holding portions of the transfer arm.

16. The processing system according to claim 8, wherein said first and second mounting surfaces of the mounting table provided in the processing chamber form an electrostatic chuck for electrostatically holding the object.

17. The processing system according to claim 16, further comprising a dechuck mechanism for releasing the object from absorption due to residual charge of the electrostatic chuck.

18. The processing system according to claim 8, wherein at least one of said side walls of the processing vessel is rotatably attached to the bottom portion of the processing vessel by means of a hinge, whereby the side walls can be opened outward.

* * * * *